United States Patent [19]

Kishi

[11] Patent Number: 4,725,876
[45] Date of Patent: Feb. 16, 1988

[54] SEMICONDUCTOR DEVICE HAVING AT LEAST TWO RESISTORS WITH HIGH RESISTANCE VALUES

[75] Inventor: Jun Kishi, Tokyo, Japan

[73] Assignee: Nippon Electric Co., Ltd., Tokyo, Japan

[21] Appl. No.: 867,422

[22] Filed: May 15, 1986

[30] Foreign Application Priority Data

May 27, 1981 [JP] Japan ................................ 56-80408
Oct. 16, 1981 [JP] Japan ................................ 56-165338

[51] Int. Cl.⁴ ............................................ H01L 27/02
[52] U.S. Cl. ......................................... 357/51; 338/48
[58] Field of Search ................ 357/51; 338/22 SD, 48

[56] References Cited

U.S. PATENT DOCUMENTS 3,666,995  5/1972  Wensink et al. ..................... 357/51
3,906,430  6/1978  Hareyama et al. ................... 357/51

FOREIGN PATENT DOCUMENTS 1250988  10/1971  United Kingdom ................. 357/51

Primary Examiner—Andrew J. James
Assistant Examiner—Mark Prenty
Attorney, Agent, or Firm—Sughrue, Mion, Zinn, Macpeak, and Seas

[57] ABSTRACT

A semiconductor device comprising at least two pinch resistors or two ion-implanted resistors having a precise resistance ratio therebetween. The pinch resistor and ion-implanted resistor have at least one region contributing to the determination of a resistance value, respectively. In two pinch resistors or two ion-implanted resistors, a ratio in number of a plurality of regions in one resistor to at least one region in the other resistor is selected to be identical to the resistance ratio of one resistor to the other resistor, resulting in that a precise resistance ratio is realized despite different configurations of the two resistors.

8 Claims, 19 Drawing Figures

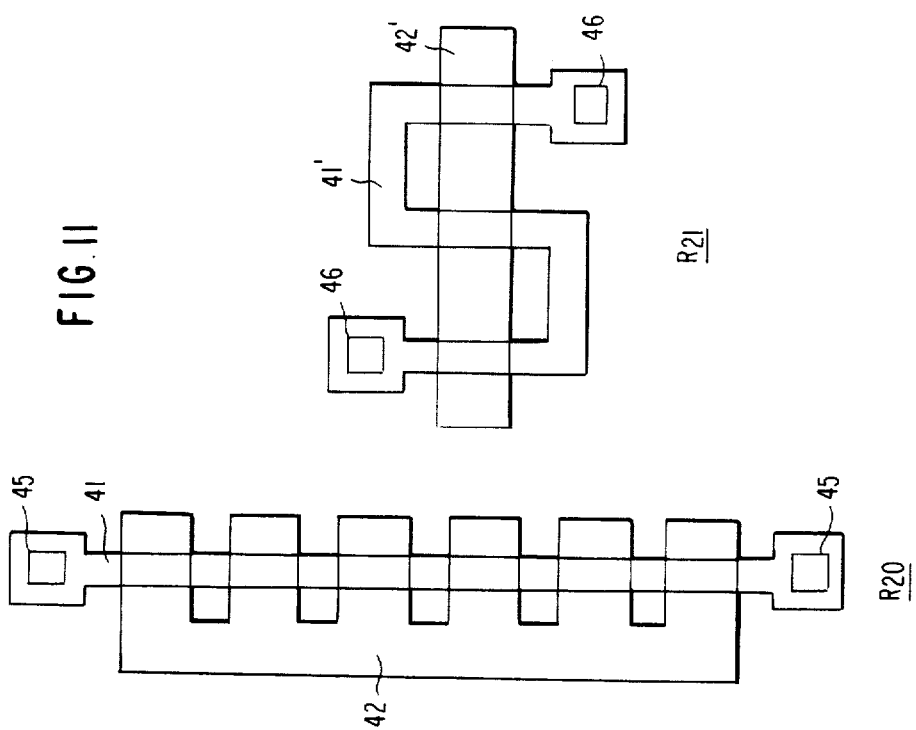
FIG. 11
FIG. 8
FIG. 9
FIG. 10
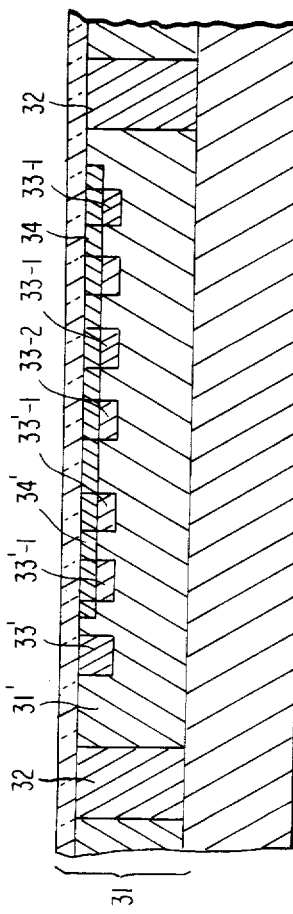
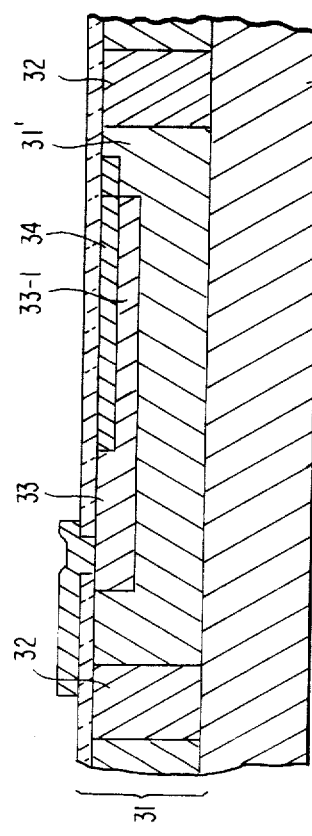
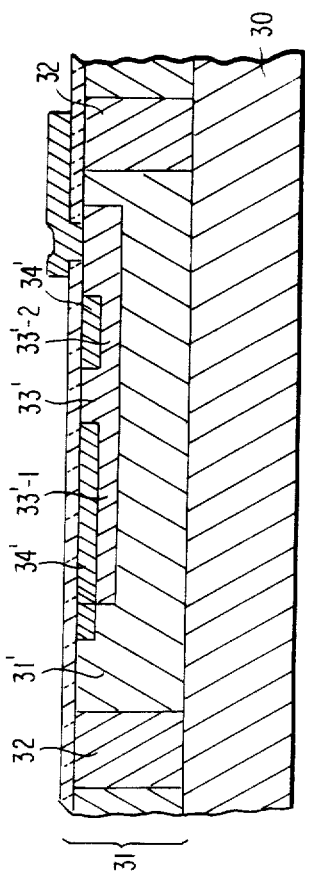

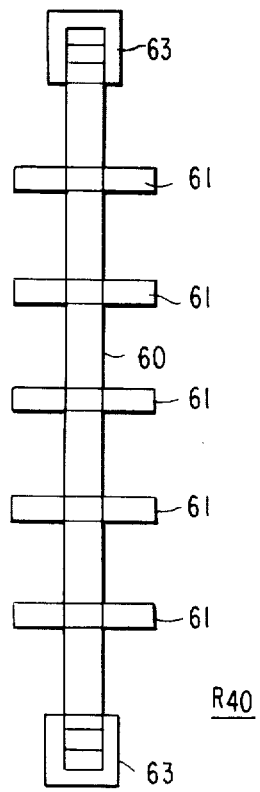
FIG. 16
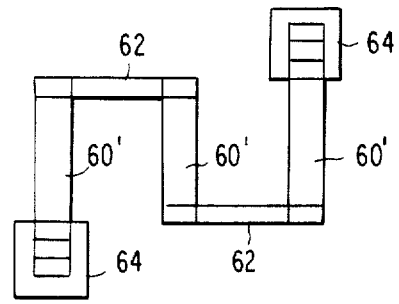
FIG. 17
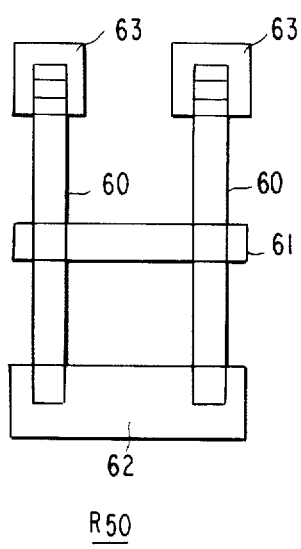
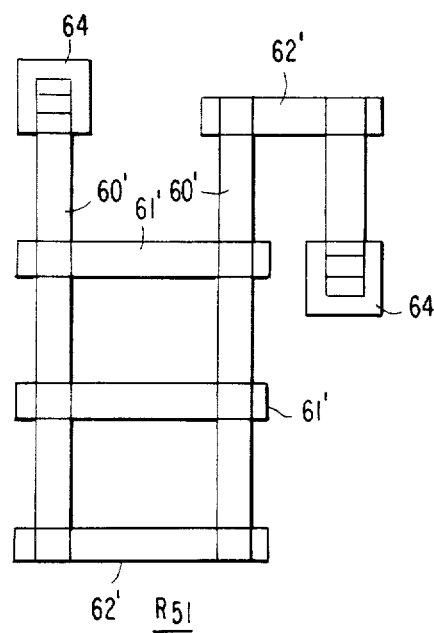

SEMICONDUCTOR DEVICE HAVING AT LEAST TWO RESISTORS WITH HIGH RESISTANCE VALUES

This is a continuation of application Ser. No. 382,520, filed 5/27/82, now abandoned.

BACKGROUND OF THE INVENTION

The present invention relates to a semiconductor device, and more particularly to a resistor having a high resistance value in a monolithic integrated circuit (hereinafter called a "monolithic IC").

A resistor in a monolithic IC, for instance, in a bipolar monolithic IC comprising circuit elements formed in an N-type epitaxial layer on a P-type substrate, is normally constructed of a P-type strip-shaped region formed in the N-type epitaxial layer simultaneously with formation of a base region of a NPN transistor. The sheet resistance and junction depth of the strip-shaped region are uniquely determined depending upon a characteristic of the NPN transistor. Therefore, a predetermined resistance value is realized by adjusting the width and/or length of the strip-shaped region. However, the sheet resistance of the strip-shaped region is low. For this reason, in order to obtain a resistor having a high resistance value, the length of the strip-shaped region would become very long. As a result, the area occupied by the strip-shaped region would become very large.

For the purpose of realizing a resistor having a high resistance value without increasing the occupation are, the so-called pinch resistor and ion-implanted resistor have been used. These resistors have been employed in MOS-type monolithic ICs. The pinch resistor is such that an $N^+$-type region is formed on the P-type strip-shaped resistor region so as to overlap with a part of the P-type strip-shaped resistor region and to connect with the N-type region in which the P-type resistor region has been formed, and electrical connection is provided at both ends of the strip-shaped resistor region. The thickness of the strip-shaped region is partially reduced by the overlapping $N^+$-type region, and moreover, the portion having a relatively high impurity concentration along the surface of the strip-shaped region does not substantially contribute to the determination of the resistance value. As a result, the resistance value is substantially determined by the sheet resistance of a P-type portion under the overlapping $N^+$-type region and the width and length of this overlapped P-type portion. The sheet resistance of the P-type portion is increased by about one order of magnitude. Thus, a resistor having a high resistance value can be realized without increasing the occupation area of the resistor.

On the other hand, the ion-implanted resistor is constituted by an ion-implanted region having a high sheet resistance, i.e., by a strip-shaped region formed by implanting P-type impurity ions into a surface portion of an N-type region at a low concentration. Since the sheet resistance of the ion-implanted region is relatively high, good ohmic contact between an electrode and the ion-implanted region cannot be realized. Hence, contact regions having a low sheet resistance are formed at both ends of the strip-shaped region, and electrodes for the ion-implanted resistor are formed on the contact regions. Accordingly, the resistance value of the ion-implanted resistor is substantially determined by the portion of the ion-implanted region that is located between the contact regions. The formation of the ion-implanted region by the ion-implantation of an impurity is effected before the formation of the electrodes but after active regions for circuit elements have been formed. If heat treatments for forming the active regions are effected after ion-implantation of impurities, the implanted impurities would be rediffused by the heat treatments, so that a desired high sheet resistance could not be obtained. Due to the fact that the ion implantation step is effected after all active regions have been formed as described above, a thickness of a surface insulating film on the ion-implanted region is extremely thin as compared to that of the surface insulating film on its surrounding region which has been formed through several heat treatments included in the diffusion steps effected before the ion implantation step. In other words, the difference in thickness between the surface insulating film on the ion-implanted region and that on its surrounding region is considerably large. For this reason, in the event that an interconnection conductor passes over an ion-implanted resistor, it may possibly occur thsat the interconnection conductor is broken at the steps of the insulating films. In order to obviate this shortcoming, a semiconductor region is additionally formed simultaneously with the contact regions in the ion-implanted resistor. The interconnection conductor crosses above this semiconductor region, the insulating film on which is thick during the subsequent steps including the heat treatment. Since this semiconductor region has a low sheet resistance, the ion-implanted region is elongated by the length corresponding to the length of that semiconductor region. Consequently, an ion-implanted resistor over which an interconnection conductor passes includes at least two ion-implanted resistor regions, two contact regions and a semiconductor region having a low sheet resistance for connecting the two ion-implanted resistor regions to each other. This semiconductor region is referred to, hereinafter, as a connecting region.

Where the aforementioned pinch resistors and ion-implanted resistors are used as resistors in a circuit such as, for example, a differential amplifier, a flip-flop or resistance divider circuit which requires a precise resistance ratio, a current flowing through the circuit could be reduced for a low power consumption, and further the design of a desired heat dissipation capacity of a package for sealing a semiconductor chip could become easy. However, with respect to the pinch resistor, undesired expansion of the $N^+$-type region overlapping the P-type resistor region which occurs in its formation by diffusion or annealing directly influences the resistance value of the pinch resistor, while in the ion-implanted resistor undesired expansion of the contact regions and the connecting region occurring in their formation directly influence the resistance value of the ion-implanted resistor. More particularly, with the expansion of the $N^+$-type region in the pinch resistor, the length of the P-type portion overlapped with the $N^+$-type region is undesirably expanded, so that the resistance value of the pinch resistor becomes higher. On the other hand, the expansion of contact regions and the connecting region in the ion-implanted resistor undesirably decreases the length of the ion-implanted resistor region between them, so that the resistance value of the ion-implanted resistor becomes lower. For this reason, it has been almost impossible to realize a precise resistance ratio by the use of pinch resistors or ion-implanted resistors, even if the lengths of the respective resistors are made to have an intended ratio. Where the intended ratio is one, it is difficult to form two resistors in a congruent shape desired from the point of view of a pattern layout including transistors and other elements, and it is impossible to realize the ratio of one with two resistors of different configurations.

SUMMARY OF THE INVENTION

It is therefore one object of the present invention to provide a semiconductor device including at least two resistors having high resistance values with a precise resistance ratio.

Another object of the present invention is to provide a semiconductor device in which a resistance ratio between resistors having different configurations can be precisely achieved.

A semiconductor device according to the present invention comprises first and second resistor regions of one conductivity type formed in a semiconductor region of opposite conductivity type. The first and second resistor regions have different configurations from each other. The first resistor region includes a plurality of first portions which contribute to the determination of the resistance value of the first resistor, and the second resistor region includes at least one second portion which contributes to the determination of the resistance value of the second resistor. The ratio of the number (two or more) of the first portions to the number (one or more) of the second portions is made identical to the intended ratio of the resistance value of the first resistor to the second resistor. It is preferable that the first and second resistor regions have the same width. It is also preferable that the width of the respective first portions is the same and substantially equal to the width of the at least one second portion, and that the ratio of the sum of the lengths of all the first portions to the total length of the at least one second portion is made equal to the intended resistance ratio of the first and second resistors.

In the case where the first and second resistors are pinch resistors, a semiconductor device according to the present invention further comprises a plurality of third semiconductor regions of the opposite conductivity type overlapping the respective first portions and at least one fourth semiconductor region overlapping the second portion. Consequently, the first and second portions in the first and second resistor regions are pinched between the common semiconductor region and the third and fourth semiconductor regions, respectively. On the other hand, if the first and second resistors are ion-implanted resistors, the first and second portions are the portions in the first and second resistor regions having an inherent sheet resistance obtained by ion implantation, respectively, located between two of the contact regions and connection region. Hence, for instance, in the event that there exist two first portions, two third semiconductor regions are provided in the case of pinch resistors, while in the case of ion-implanted resistors there are two portions in the first resistor region having the inherent sheet resistance obtained by ion implantation and located between contact regions and a connecting region. The two first portions in the pinch resistors are connected by the portion in the first resistor region on which the third semiconductor region is not formed, while the two first portions in the ion-implanted resistors are connected by the portion (i.e. a connecting region) in the first resistor region having a sheet resistance lower than that obtained by the ion implantation. In the pinch resistors and ion-implanted resistors, the portion for connecting the two first portions to each other does not substantially contribute to the determination of the resistance value of the first resistor, because it has a considerably small sheet resistance as compared to that of the first portions.

As noted previously, the ratio of the number of the first portions to that of the second portion or portions is determined so as to coincide with the intended ratio of the resistance value of the first resistor to that of the second resistor. For instance, if the resistsance ratio is 2, then the ratio of the number of first portions to that of the second portion or portions is also chosen to be 2. Accordingly, in the case of pinch resistors, the ratio of the error caused by the expansion of the third semiconductor regions in the first resistor to that caused by the expansion of the fourth semiconductor region in the second resistor becomes identical to the resistance ratio of the first resistor to the second resistor. In other words, the resistance ratio between the pinch resistors can be precisely obtained. Also in the case of ion-implanted resistors, the ratio of the error caused by the expansions of the contact regions and the connecting region in the first resistor to that caused by the expansion of the contact regions and the connecting region in the second resistor becomes identical to the resistance ratio of the first resistor to the second resistor, so that the resistance ratio between the ion-implanted resistors can be precisely achieved. Therefore, the pinch resistors or ion-implanted resistors according to the present invention can be used as the resistors in a circuit which requires a precise resistance ratio. As a result, the reduction of a circuit current can be achieved, and freedom in the design of a package having a desired heat dissipation capacity can also be enhanced.

BRIEF DESCRIPTION OF THE DRAWINGS

The above and other objects, features and advantages of the present invention will become more apparent by reference to the following detailed description of the invention taken in conjunction with the accompanying drawings, wherein:

FIGS. 8, 9 and 10 are cross-section views taken along lines A-A', B-B' and C-C' in FIG. 7, respectively;

FIG. 11 is a plan view showing a second preferred embodiment of the present invention;

FIGS. 16, 17, 18 and 19 are plan views showing fourth, fifth, sixth and seventh preferred embodiments of the present invention, respectively.

DETAILED DESCRIPTION OF THE PRIOR ART

Figure 1:
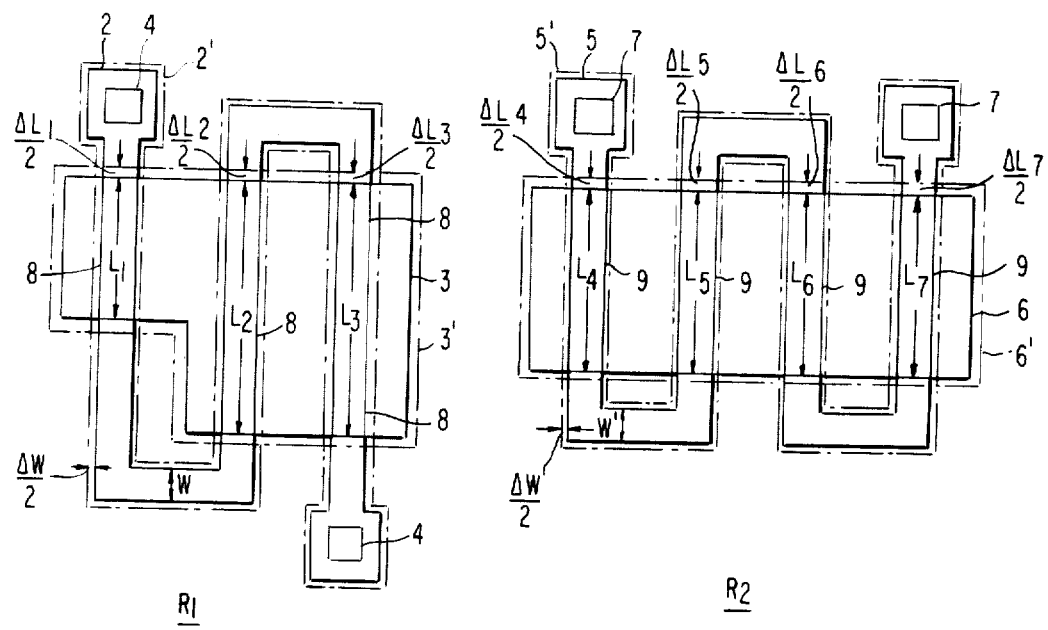
FIG. 1 is a plan view showing two pinch resistors formed in accordance with the prior art technique aiming at a resistance ratio of 1:1.

FIG. 1 shows two pinch resistors $R_1$ and $R_2$ which have been produced in accordance with the prior art technique aiming at a resistance ratio of 1:1. The pinch resistors $R_1$ and $R_2$ are produced by forming, for instance, P-type diffused layers 2 and 5 in an N-type semiconductor layer and further forming N+-type diffused layers 3 and 6 so as to partly overlap with the diffused layers 2 and 5, respectively. Both end portions of the diffused layers 2 and 5 are broadened, and contact windows 4 and 7 for electrodes are formed on the broadened portions. As is well known in the art, an IC typically includes a great number of circuit elements such as transistors and diodes, together with the pinch resistors $R_1$ and $R_2$, with all of the elements and pinch resistors being formed on the same substrate. Accordingly, a limited area on the substrate is allotted to the resistor $R_1$ and another limited area is allotted to the resistor $R_2$, both surrounded by other circuit elements. Dependent upon the layout of the remaining circuit elements, the two areas allotted for the resistors $R_1$ and $R_2$ will most often be of different shapes and sizes, and it only rarely happens that the allotted areas have the same shape. In order to form each pinch resistor having a length necessary to obtain a desired resistance value in the corresponding allotted are of the substrate, the P-type diffused layer 2 in the resistor $R_1$ is formed in an S-shape, and the P-type diffused layer 5 in the resistor $R_2$ is formed in a W-shape. The N+-type diffused layer 3 overlaps with three portions of the P-type diffused layer 2, and the N+-type diffused layer 6 overlaps four portions of the P-type diffused layer 5. Since P-type portions 8 and 9 pinched between the N+-type diffused layers 3 and 6 and the N-type semiconductor layer have a high sheet resistance, these portions essentially determine the resistance values of resistors $R_1$ and $R_2$. The portions of the P-type diffused layers 2 and 5 other than the P-type portions 8 and 9 do not substantially contribute to the resistance values of the resistors $R_1$ and $R_2$ due to their low sheet resistances. In other words, the resistance value of the resistor $R_1$ is substantially determined by the four P-type portions 9. The inventor has found that the diffused layers take the configurations, as indicated by the chain line contours 2', 5', 3' and 6', after impurities have been diffused, although they are designed to have configurations as shown in solid line contours 2, 5, 3 and 6 in a mask pattern. Thus, the configurations of the diffused layers are, in practice, enlarged as compared to the designed configurations because of the lateral diffusion of the impurities. In addition, the impurity concentration of the N+-type diffused layers 3 and 6 is high, and therefore the lateral enlargement of the N+-type diffused layers 3 and 6 is larger than that of layers 2 and 5. The inventor has thus considered and analyzed the resistance ratio between the pinch resistors $R_1$ and $R_2$ having the aforementioned configurations, as detailed below.

At first, a simplified formula for generally representing a resistance value of R of a pinch resistor is given by the following equation:

$$R = \rho_{PINCH} \cdot \frac{L\left(1 + \frac{\Delta L}{L}\right)}{W\left(1 + \frac{\Delta W}{W}\right)} + \alpha \quad (1)$$

where $\rho_{PINCH}$ represents the sheet resistance of a P-type portion pinched between two N-type layers; W and L represent the width and length on a mask pattern of the P-type portion, respectively; and $\Delta W$ and $\Delta L$ represent increments of the width W and the length L caused by the lateral diffusion of the impurities, respectively. the $\Delta W$ and $\Delta L$ have a positive sign due to the expansion of the upper N+-type layer as well as the expansion of the P-type layer.

In FIG. 1, since the sheet resistance $\rho_{PINCH}$ of the P-type portions 8 and 9 are almost constant in the same wafer in which the resistors $R_1$ and $R_2$ are to be fabricated, and further since the fabrication conditions such as the conditions for impurity diffusion, the etching condition, etc. are also nearly the same, the resistance value of $R_1$ of the resistor $R_1$ is represented by the following equation:

$$R_1 = \rho_{PINCH} \cdot \frac{L_1\left(1 + \frac{\Delta L_1}{L_1}\right) + L_2\left(1 + \frac{\Delta L_2}{L_2}\right) + L_3\left(1 + \frac{\Delta L_3}{L}\right)}{W\left(1 + \frac{\Delta W}{W}\right)} + \alpha \quad (2)$$

where $\rho_{PINCH}$: the sheet resistance of the P-type portions 8;
$L_1, L_2, L_3$: lengths of the P-type portions 8 on a mask;
$\Delta L_1, \Delta L_2, \Delta L_3$: increments of lengths of the P-type portions 8 by the expansion of the N+-type layer 3;
W: the width of the P-type portion 8 on a mask;
$\Delta W$: the increment of the width of the P-type portion 8 by the expansion of the P-type layer 2; and
$\alpha$: a sum of the contact resistances of electrodes (not shown) connected to the layer 2 through the contact windows 4 and the resistances of the portions of the P-type diffused layer 2 on which the N+-type diffused layer 3 is not formed.

The second term on the right side of Equation-(2) is negligibly small as compared to the first term on the right side. Hence, Equation-(2) can be reduced into the following equation:

$$R_1 = \rho_{PINCH} \cdot \frac{L_1\left(1 + \frac{\Delta L_1}{L_1}\right) + L_2\left(1 + \frac{\Delta L_2}{L_2}\right) + L_3\left(1 + \frac{\Delta L_3}{L_3}\right)}{W\left(1 + \frac{W}{W}\right)} \quad (2)'$$

Likewise, with regard to the resistor $R_2$, the following equation is fulfilled:

$$R_2 = \rho_{PINCH} \cdot \frac{L_4\left(1 + \frac{\Delta L_4}{L_4}\right) + L_5\left(1 + \frac{\Delta L_5}{L_5}\right) + L_6\left(1 + \frac{\Delta L_6}{L_6}\right) + L_7\left(1 + \frac{\Delta L_7}{L_7}\right)}{W'\left(1 + \frac{\Delta W'}{W'}\right)} \quad (3)$$

As noted previously, since the resistors $R_1$ and $R_2$ in FIG. 1 have been fabricated aiming at a resistance ratio of 1:1, the widths and lengths of the resistors $R_1$ and $R_2$ have been chosen so as to fulfill the relationships $W = W'$ and $L_1 + L_2 + L_3 = L_4 + L_5 + L_6 + L_7 = L$. Consequently, the resistance ration $R_2/R_1$ between the resistors $R_1$ and $R_2$ is represented by the following equation:

$$\frac{R_2}{R_1} = \frac{\rho_{PINCH} \cdot \dfrac{L_4\left(1 + \frac{\Delta L_4}{L_4}\right) + L_5\left(1 + \frac{\Delta L_5}{L_5}\right) + L_6\left(1 + \frac{\Delta L_6}{L_6}\right) + L_7\left(1 + \frac{\Delta L_7}{L_7}\right)}{W'\left(1 + \frac{\Delta W'}{W'}\right)}}{\rho_{PINCH} \cdot \dfrac{L_1\left(1 + \frac{\Delta L_1}{L_1}\right) + L_2\left(1 + \frac{\Delta L_2}{L_2}\right) + L_3\left(1 + \frac{\Delta L_3}{L_3}\right)}{W\left(1 + \frac{\Delta W}{W}\right)}} \quad (4)$$

$$= \frac{L_4 + L_5 + L_6 + L_7 + \Delta L_4 + \Delta L_5 + \Delta L_6 + \Delta L_7}{L_1 + L_2 + L_3 + \Delta L_1 + \Delta L_2 + \Delta L_3}$$

$$= \frac{L + \Delta L_4 + \Delta L_5 + \Delta L_6 + \Delta L_7}{L + \Delta L_1 + \Delta L_2 + \Delta L_3}$$

Since the lateral expansion of the $N^+$-type diffused layers 3 and 6 is identical on the same wafer, the relations of $\Delta L_1 = \Delta L_3 = \Delta L_4 = \Delta L_5 = \Delta L_6 = \Delta L_7 = \Delta L$ are fulfilled, so that Equation (4) is reduced into the following equation:

$$\frac{R_2}{R_1} = \frac{4\Delta L + L}{3\Delta L + L} \quad (5)$$

As a result, the terms $4\Delta L$ and $3\Delta L$ have become main factors of the error in resistance ratio. In other words, even if the total resistor length L is selected to be equal in each of the pinch resistors $R_1$ and $R_2$, an error in the resistance ratio would arise as represented by Equation-(5).

By generalizing Equation-(5) so as to cover more general cases, the inventor has derived the following Equation-(6). At this time, it is assumed that the widths of the resistor sections are equal to each other:

$$\frac{R_2}{R_1} = \frac{\rho_{PINCH} \cdot \dfrac{n'\Delta L + \beta L}{W\left(1 + \frac{\Delta W}{W}\right)}}{\rho_{PINCH} \cdot \dfrac{n\Delta L + L}{W\left(1 + \frac{\Delta W}{W}\right)}} = \frac{n'\Delta L + \beta L}{n\Delta L + L} \quad (6)$$

where n: the number of the overlapped portions between the $N^+$-type diffused layer 3 and the P-type diffused layer 2 in the resistor $R_1$, that is, the number of P-type portions 8;

n': the number of the overlapped portions between the $N^+$-type diffused layer 6 and the P-type diffused layer 5 in the resistor $R_2$, that is, the number of the P-type portions 9; and $\beta$: the ratio of the total length of the P-type portions 9 in the resistor $R_2$ to that of the P-type portions 8 in the resistor $R_1$.

The inventor had discovered that, since the ratio between the numbers n and n' differs from an intended resistance ratio, that is, from the total length ratio $\beta$ of the P-type portions, the resistance ratio between the resistors $R_1$ and $R_2$ given by Equation-(6) would deviate from the intended resistance ratio. Therefore, in order to eliminate the deviation of the resistance ratio between the resistors $R_1$ and $R_2$, it is necessary to select the numbers n and n' of the overlapped portions in Equation-(6) in accordance with the resistance ratio. In the case where the resistance ratio is one, the number n should be selected to equal the number n'. For this purpose, in the prior art either the P-type diffused layer 2 was formed in the same W-shape as the P-type diffused layer 5 or the P-type diffused layer 5 was formed in the same S-shape as the P-type diffused layer 2. In other words, in order to obtain a precise resitance ratio, the resistor Rhd 1 and the resistor $R_2$ were formed in congruent configurations. However, this results in a restriction in the pattern layout. Moreover, in the case where the resistance ratio is larger than 1 or the configurations between two resistors are different as shown in FIG. 2, a precise resistance ratio could not be realized due to the different configurations of the two resistors.

Figure 2:
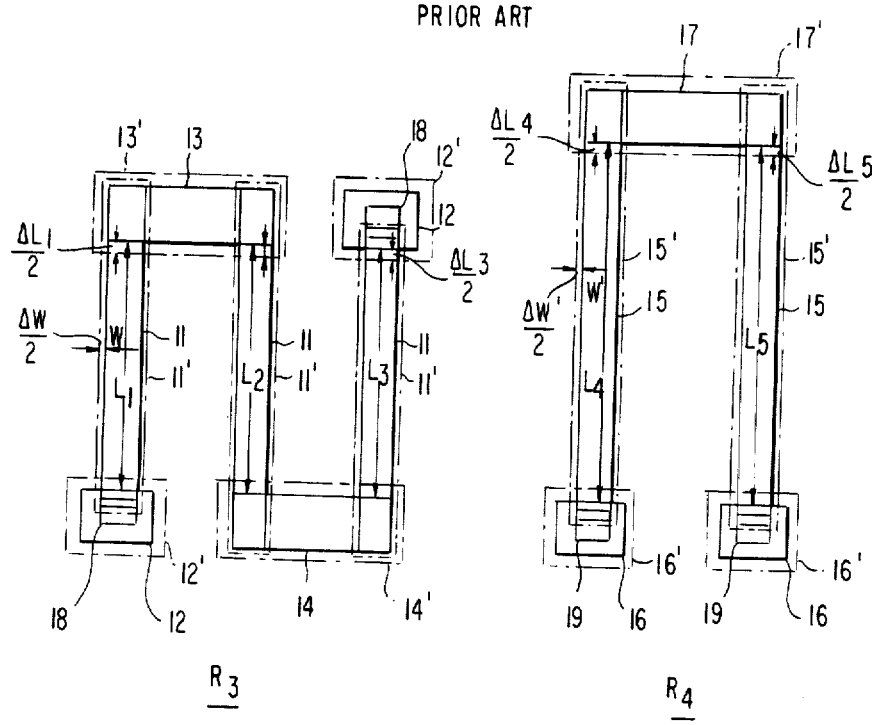
FIG. 2 is a plan view showing two ion-implanted resistors formed in accordance with the prior art technique aiming at a resistance ratio of 1:1.

Referring now to FIG. 2, two ion-implanted resistors $R_3$ and $R_4$ fabricated in accordance with the prior art technique aiming at a resistance ratio of 1:1 are shown. The ion-implanted resistors have P-type ion-implanted regions 11 and 15 having a high sheet resistance which are formed in an N-type layer through the ion-implantation of P-type impurities, and further have P-type contact regions 12 and 16 having a high impurity concentration which are formed at both ends of the P-type ion-implanted regions 11 and 15 simultaneously with formation of a base region, respectively. From the viewpoint of a pattern layout, the resistors $R_3$ and $R_4$ are formed in an S-shape and in a U-shape, respectively.

Moreover, the resistor configurations shown in FIG. 2. are suitable for the case where interconnection conductors have to pass over the ion-implanted resistors $R_3$ and $R_4$ due to wiring pattern considerations. More particularly, the ion-implanted resistors $R_3$ and $R_4$ are provided with respective regions 13 and 17 having a low sheet resistance. The interconnection conductor passing over the resistor $R_3$ crosses over the region 13, while the interconnection conductor passing over the resistor $R_4$ crosses over the region 17. Since no wiring crosses over a region 14 in the resistor $R_3$, it will be seen that this region 14 may be formed as an ion-implanted region connected to the ion-implanted regions 11. In this case, however, two bent corners, i.e., direction changes, would arise in the ion-implanted region 11 of the resistor $R_3$. On the other hand, in the resistor $R_4$ there is no bent corner of the ion-implanted region 15. Thus, if there exists a difference in the number of bent corners of ion-implanted regions between two resistors, the desired resistance ratio between the resistors $R_3$ and $R_4$ cannot be obtained due to fluctuations in the resistance at each bent corner. For the purpose of obtaining a desired resistance value, it is necessary to make the number of bent corners of ion-implanted regions equal in each of the two resistors. Since the number of bent corners in the resistor $R_4$ is zero, the region 14 formed simultaneously with the region 13 is provided in order that the number of the bent corners in the resistor $R_3$ is also zero. As a result, the resistance value of the resistor $R_3$ is substantially determined by three ion-implanted regions 11, while that of the resistor $R_4$ is substantially determined by two ion-implanted regions 15. The regions 12, 13, 14, 16 and 17 are formed simultaneously. Further, in order to control the sheet resistances of the ion-implanted regions 11 and 15, the regions 12, 13, 14, 16 and 17 are formed earlier than the ion-implanted regions 11 and 15. Contact windows 18 and 19 are provided in surface insulating films (not shown) on the contact regions 12 and 16, respectively. The inventor has found that the respective regions take the configurations, as indicated by chain line contours 12', 13', 14', 16' and 17', after impurities have been diffused, although they are designed to have configurations as shown in solid line contours 12, 13, 14, 16 and 17 in a mask pattern. In addition, solid line contours of the regions 11 and 15 indicate the configurations on a mask pattern to be used for ion-implantation, whereas chain line contours 11' and 15' indicate the configurations of the ion-implanted regions actually produced by the annealing treatment for activating the ion-implanted impurities. Since the impurity concentration in regions 12, 13, 14, 16 and 17 is high, these regions expand more than the ion-implanted regions 11 and 15.

The inventor has analyzed the resistance ratio between the ion-implanted resistors $R_3$ and $R_4$ having the aforementioned configurations. At first, a simplified formula for generally representing a resistance R of an ion-implanted resistor is given by the following equation:

$$R = \rho_S \cdot \frac{L\left(1 - \frac{\Delta L}{L}\right)}{W\left(1 + \frac{\Delta W}{W}\right)} + \alpha \tag{7}$$

where $\rho_S$ represents a sheet resistance of an ion-implanted region; L and W represent the length and a width of the ion-implanted region on a mask pattern; $\Delta W$ represents an increment of the width of the ion implanted region caused by the annealing treatment; and $\Delta L$ represents a decrement of the length of the ion-implanted region caused by expansion of the contact regions 12 and 16 and the regions 13, 14 and 17, whereby the actual length of the ion-implanted region is reduced. In addition, $\alpha$ represents the sum of the contact resistances of electrodes (not shown) connected to contact regions 12 and 16 through the windows 18 and 19 and the resistances of the regions 13, 14, and 17. The value of $\alpha$ is negligibly small as compared to the first term on the right side of Equation-(7). Therefore, on the basis of Equation-(7) with the term $\alpha$ omitted, the resistance values $R_3$ and $R_4$ of the resistors $R_3$ and $R_4$ shown in FIG. 2 can be derived as follows:

$$R_3 = \rho_S \cdot \frac{L_1\left(1 - \frac{\Delta L_1}{L_1}\right) + L_2\left(1 - \frac{\Delta L_2}{L_2}\right) + L_3\left(1 - \frac{\Delta L_3}{L}\right)}{W\left(1 + \frac{\Delta W}{W}\right)} \tag{8}$$

$$R_4 = \rho_S \cdot \frac{L_4\left(1 - \frac{\Delta L_4}{L_4}\right) + L_5\left(1 - \frac{\Delta L_5}{L_5}\right)}{W\left(1 + \frac{\Delta W}{W}\right)} \tag{9}$$

As described previously, since the resistors $R_3$ and $R_4$ have been designed aiming at a resistance ratio of 1:1, the relationships $W = W'$ and $L_1 + L_2 + L_3 = L_4 + L_5 = L$ are fulfilled. In addition the sheet resistances $\rho_S$ of the ion-implanted regions 11 and 15 as well as the lateral diffusion of impurities are identical in the same wafer. As a result, the inventor has derived the Equation-(10) which represents the resistance ratio $R_4/R_3$ between the resistors $R_4$ and $R_3$:

$$\frac{R_4}{R_3} = \frac{L - 2\Delta L}{L - 3\Delta L} \tag{10}$$

The inventor has found that, even if the respective resistors $R_3$ and $R_4$ are designed to have the same total resistor length L in order to precisely realize a resistance ratio of 1:1, the actual resistance is not 1:1 but includes an error due to the terms $3\Delta L$ and $2\Delta L$ in Equation-(10). This is due to the fact that the ion-implanted regions 11 in the resistor $R_3$ are connected through two high concentration regions 13 and 14, whereas the ion-implanted regions 15 in the resistor $R_4$ are connected by a single high concentration region 17, and therefore the errors in the total resistor length L due to the lateral expansion of these high concentration regions 13, 14 and 17 are different between the two resistors $R_3$ and $R_4$. In other words, with such configurations of the resistors, a precise resistance ratio cannot be realized. Since no wiring crosses over the region 14, the error in the resistance ratio caused by lateral diffusion of impurities can be reduced by converting the region 14 into an ion-implanted region. However, as noted previously, additional bent corners of the ion-implanted regions are produced in this case, so that fluctuations of a resistance at the bent corners would influence the resistance ratio. This influence upon the resistance ratio is larger than the influence caused by lateral diffusion of impurities.

Now generalizing Equation-(10) so as to cover more general cases, the following equation is obtained:

$$\frac{R_4}{R_3} = \frac{\beta L - n'\Delta L}{L - n\Delta L} \quad (11)$$

where n and n' represent the numbers of the ion-implanted regions 11 and 15, respectively, and $\beta$ represents the ratio of the total length of all the ion-implanted regions 15 in the resistor $R_4$ to that of all the ion-implanted regions 11 in the resistor $R_3$.

From Equation-(11) the inventor has discovered that as the ratio between the numbers n and n' differs from an intended resistance ratio, that is, from the total length ratio $\beta$ of the ion-implanted regions, the resistance ratio between the resistors $R_3$ and $R_4$ would deviate from the intended resistance ratio. Therefore, in order to eliminate the deviation of the resistance ratio between the resistors $R_3$ and $R_4$ in the case where the intended resistance ratio is one, it is necessary to select the numbers n and n' in Equation-(11) to be equal to each other. For this purpose, according to the prior art, the numbers of the ion-implanted regions 11 and 15 were equalized either by adding one ion-implanted region in one resistor or reducing one ion-implanted region in the other resistor, and also the numbers of bent corners of the ion-implanted regions in the respective resistors were equalized. However, this measure taken in the prior art implies that the resistors $R_3$ and $R_4$ are formed in a congruent shape, resulting in a severe restriction in the pattern layout. Moreover, in the case where the shapes of two resistors are different as shown in FIG. 2 or a resistance ratio larger than 1 is required, it is absolutely impossible to realize a precise resistance ratio.

Figure 3:
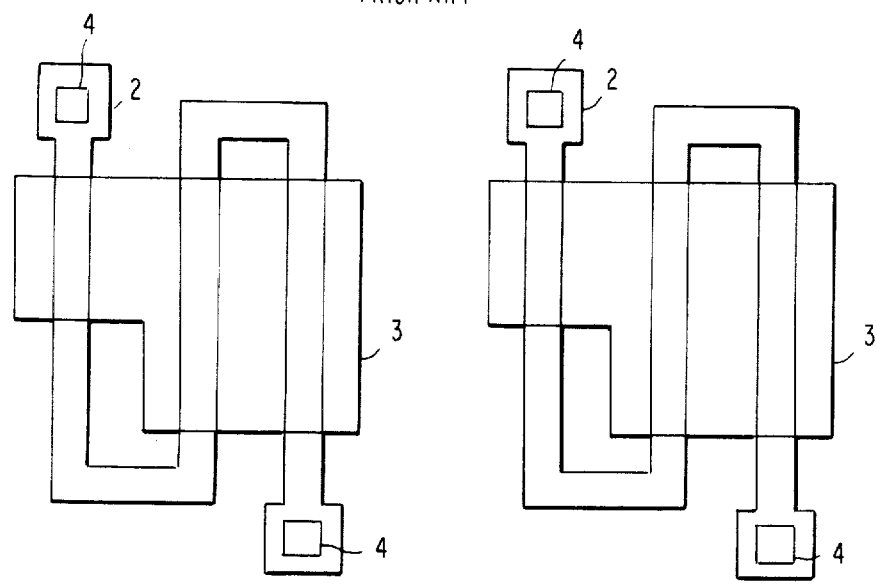
FIGS. 3 and 4 are plan views showing two pinch resistors and two ion-implanted resistors, respectively, having a precise resistance ratio of 1:1 which can be formed in accordance with the prior art technique.
Figure 4:
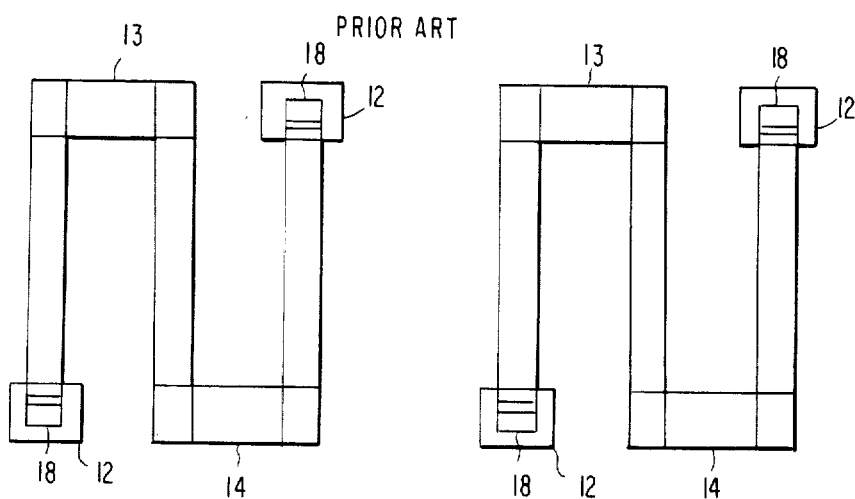

As will be seen from the above inventor's analysis of the ratio of the resistors, in the case of the fabricating two pinch resistors or two ion-implanted resistors having a precisely defined resistance ratio in accordance with the prior art technique, the configurations of the two resistors are necessarily congruent as shown, by way of example, in FIGS. 3 and 4. FIG. 3 shows the pinch resistor, and FIG. 4 shows the ion-implanted resistors. However, such cases are actually rare, and it often occurs that an area allotted to one resistor is different in shape and size from that allotted to another resistor on the same IC chip, depending upon the layout of the other circuit elements surrounding the allotted resistor areas as described above. In that case, the configuration of the pinch resistors must be different from each other with the lengths being equal to each other, if a resistance ratio of 1:1 is to be obtained, and an inaccurate resistance ratio has conventionally been obtained. Further, if the resistance ratio to be obtained is 1:2 or more, the configurations of the two resistors are inevitably different.

DETAILED DESCRIPTION OF THE PREFERRED EMBODIMENTS

Figure 5:
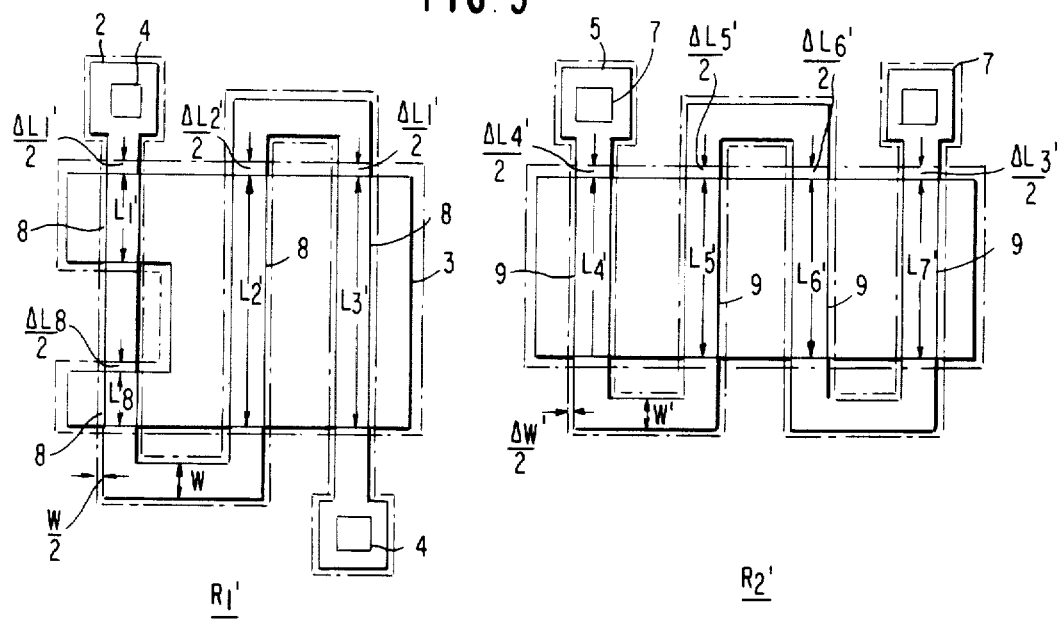
FIGS. 5 and 6 are plan views demonstrating the principle of the present invention applied to the two resistors shown in FIGS. 1 and 2, respectively.

Now the principle of the present invention will be described with reference to FIGS. 5 and 6. FIG. 5 shows the application of the present invention to two resistors $R_1$ and $R_2$ shown in FIG. 1. In FIG. 5, reference symbols similar to those appearing in FIG. 1 designate like physical quantities and reference numerals similar to those appearing in FIG. 1 designate like component parts. According to the present invention, for the purpose of obtaining the same value between the numbers n and n' appearing in Equation-(6), the number n of the P-type portions 8 pinched between the N-type epitaxial layer and the N$^+$-type diffused layer 3 in the resistor $R_1'$ is increased to 4 by modifying the shape of the N$^+$-type diffused layer in the resistor $R_1'$ without varying the shapes of the P-type diffused layers 2 and 5 in the resistors $R_1'$ and $R_2'$. In other words, by adding to the N$^+$-type diffused layer 3 an additional portion overlapping with the P-type diffused layer 2, four P-type portions 8 determine the resistance value of the resistor $R_1'$ like the resistor $R_2'$. In this instance, if the lengths $L_2'$ and $L_3'$ of two P-type portions 8 are chosen to be equal to the lengths $L_2$ and $L_3$ of the P-type portions 8 in FIG. 1, then the sum $L' + L_8$ of the lengths of other two P-type portions 8 is selected to be equal to the length $L_1$ in FIG. 1. Thus, the numbers n and n' of the overlapped portions between the N$^+$-type diffused layers 3 and 6 and the P-type diffused layers 2 and 5 in the resistors $R_1'$ and $R_2'$ are both equal to 4. In addition, the widths and lengths between the resistors $R_1'$ and $R_2'$ have relationships of $W = W'$ and $L_1' + L_2' + L_3' + L_8 = L_4' + L_5' + L_6' + L_7' = L$. Hence, substituting $n = n' = 4$ in Equation-(6), the resistance ratio $R_2'/R_1'$ between the resistors $R_1'$ and $R_2'$ in FIG. 5 is derived as follows:

$$\frac{R_2'}{R_1'} = \frac{4\Delta L + L}{4\Delta L + L} = 1 \quad (6)'$$

In other words, a precise resistance ratio of one can be realized regardless of the shapes of the P-type diffused layers 2 and 5 and independently of lateral extension of the impurity diffusion.

Figure 6:
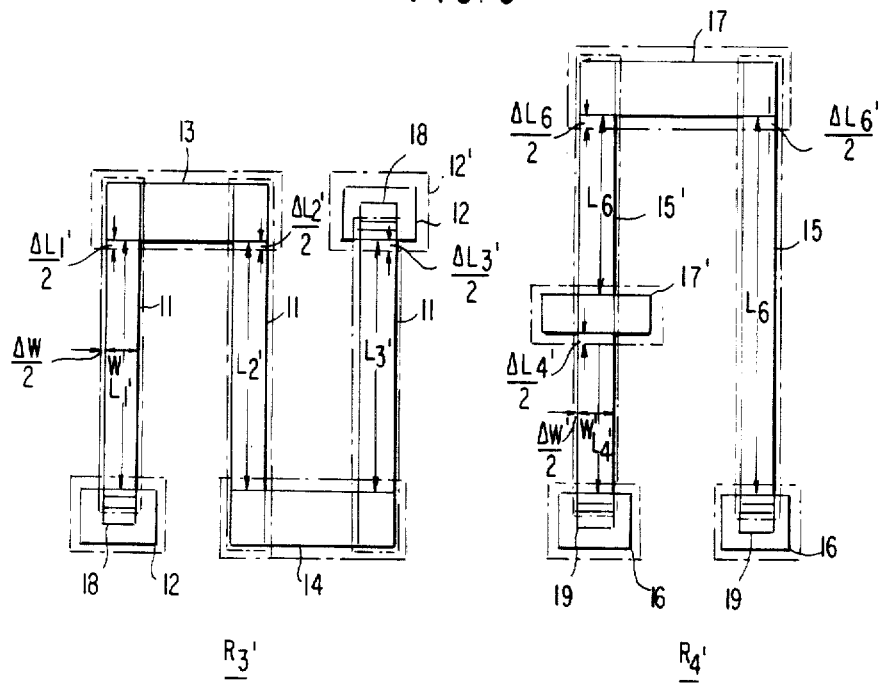

FIG. 6 shows an application of the present invention to the two ion-implanted resistors $R_3$ and $R_4$ shown in FIG. 2. In FIG. 6, reference numerals similar to those appearing in FIG. 2 designate like component parts. According to the present invention, for the purpose of obtaining the same value between the numbers n and n' represented in Equation-(11), the number n' of the ion-implanted regions which contribute to determination of the resistance value of the resistor $R_4'$ is increased by 3 by additionally forming a P-type region 17' in one part of the left side ion-implanted region 15' in the resistor $R_4'$. In this instance, the mask pattern to be used for ion-implantation is designed such that the sum $L_4' + L_6$ of the lengths of two ion-implanted regions 15' in FIG. 6 may become equal to the length $L_4$ of the left side ion-implanted region 15 in the resistor $R_4$ shown in FIG. 2. Since the numbers of the ion-implanted regions in the resistors $R_3'$ and $R_4'$ are equalized as described above, the relationship of $n = n' = 3$ is fulfilled in Equation-(11). In addition, in order to make the resistance ratio between the resistors $R_1'$ and $R_2'$ equal to 1:1, the relationship of lengths of $L_1' + L_2' + L_3' = L_4' + L_5' + L_6 = 6$ is fulfilled, and with regard to the widths also, the relationship of $W = W'$ is fulfilled. Accordingly, from Equation-(11) the resistance ratio $R_4'/R_3'$ between the resistors $R_3'$ and $R_4'$ can be derived as follows:

$$\frac{R_4'}{R_3'} = \frac{L - 3\Delta L}{L - 3\Delta L} = 1 \quad (11)'$$

In other words, even if the configurations of the ion-implanted regions are different, there are provided two resistors $R_3'$ and $R_4'$ having a precisely defined resistance ratio therebetween.

Figure 7:
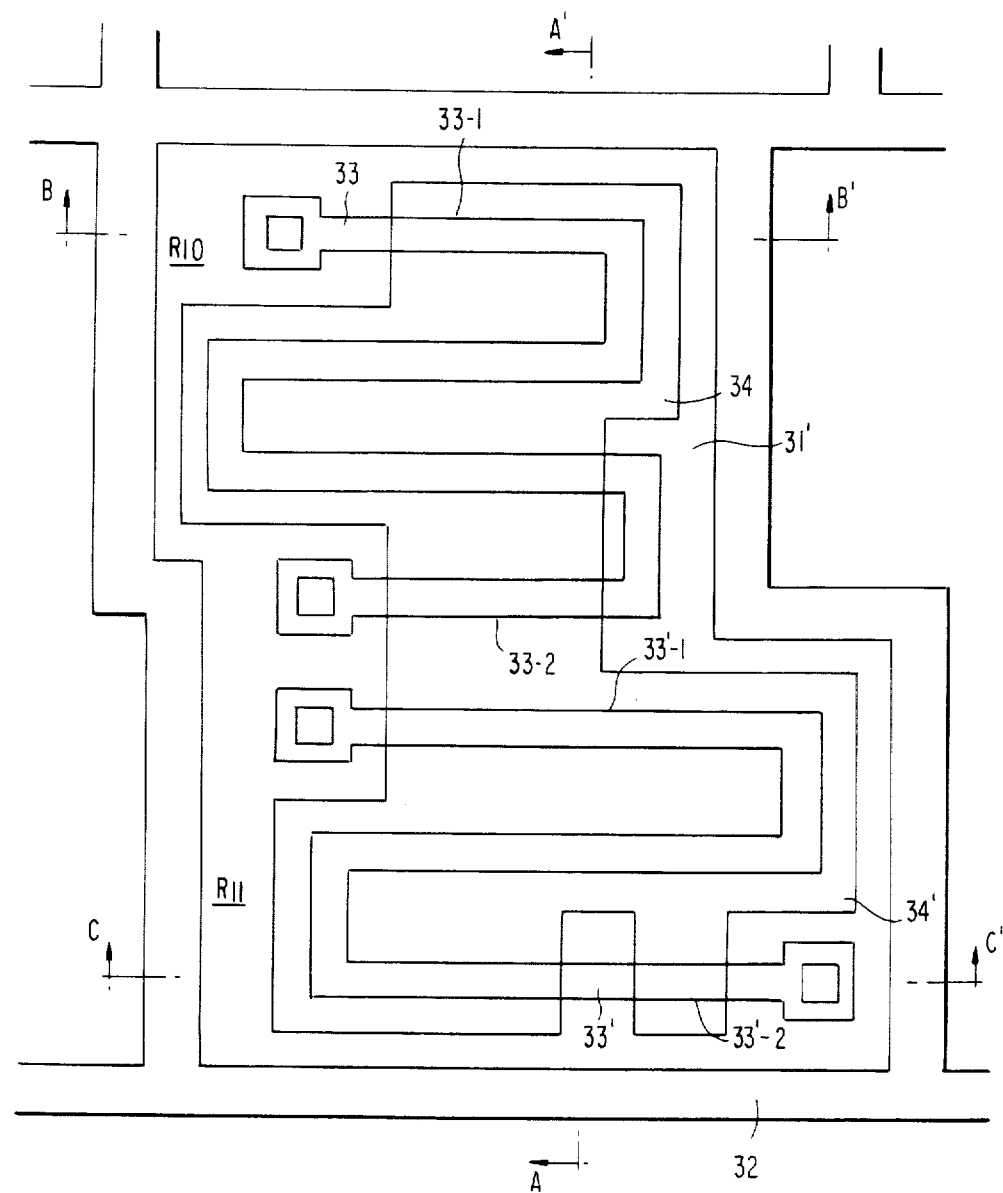
FIG. 7 is a plan view showing a first preferred embodiment of the present invention.

FIG. 7 is a plan view showing two pinch resistors $R_{10}$ and $R_{11}$ fabricated according to one preferred embodiment of the present invention. Cross-sectional views taken along lines A–A', B–B' and C–C' in FIG. 7 are shown in FIGS. 8, 9 and 10, respectively. These two resistors $R_{10}$ and $R_{11}$ are formed in a bipolar monolithic IC. More particularly, formed on a P-type substrate 30 is an N-type epitaxial layer 31 of $8.6\mu$ to $9.7\mu$ in thickness having a resistivity of 0.88 ohm-cm to 1.18 ohm-cm. The N-type epitaxial layer 31 is divided into a plurality of island regions by isolation regions 32. A P-type impurity such as boron or the like is selectively diffused into one island region 31' simultaneously with the formation of base regions (not shown) of NPN transistors, and thereby P-type regions 33 and 33' are formed in the shapes shown in FIG. 7. As seen from FIG. 7, the P-type region 33 bends substantially at a right angle 6 times between the electrodes at both ends, while the P-type region 33' bends substantially at a right angle 4 times between the electrodes at both ends. The regions 33 and 33' both have a depth of about $2.8\mu$ and a sheet resistance of 150 to 250 ohm/□. Subsequently, $N^+$-type regions 34 and 34' are formed in the shapes shown in FIG. 7 by selectively diffusing an N-type impurity such as phosphorus or the like simultaneously with the formation of emitter regions (not shown) of the NPN transistors. The depth of the regions 34 and 34' is $2.0\mu$ and their sheet resistance is 2 to 10 ohm/□. Under such a condition, the P-type portions under the regions 34 and 34' have a depth of $0.8\mu$ and a sheet resistance of 4 kohm/□. Since the $N^+$-type region 34 in the resistor $R_4$ is formed in the shape shown in FIG. 7, the resistance value of the resistor $R_{10}$ is determined by the resistance of two P-type portions 33-1 and 33-2 pinched between the $N^+$-type region 34 and the N-type epitaxial layer 31. The length of the P-type portions 33-1 and 33-2 are represented by $L_{10}$ and $L_{11}$, respectively. It is to be noted that the P-type portion 33-1 includes 4 bent corners, and the P-type portion 33-2 has no bent corner.

On the other hand, the resistor $R_{11}$, which is required to have a precisely defined resistance ratio of 1:1 with respect to the resistor $R_{10}$ having the above-described configuration, has its resistance value determined by the shape of the $N^+$-type region 34' as will be described in the following. The P-type portion 33-1 which determines the resistance value of the resistor $R_{10}$ in cooperation with the P-type portion 33-2 has four bent corners, and the P-type portion 33-2 has no bent corner. Therefore, it is preferable that the resistor $R_{11}$ also have four bent corners in the P-type portions determining its resistance value. As explained previously in connection with ion-implanted resistors, in a resistor presenting a high resistance value with a short length of a resistance region, such as a pinch resistor or an ion-implanted resistor, fluctuations in resistances at bent corners of a resistance region would largely influence the overall resistance value. Accordingly, the shape of the $N^+$-type region 34' is determined such that, in the resistor $R_{11}$, a P-type portion 33'-1 pinched between the $N^+$-type region 34' and the $N^+$-type epitaxial layer 31, and which determines the resistance value of the resistor $R_{11}$, also has four bent corners. In addition, a desired resistance value of the resistor $R_{10}$ is realized by two P-type portions 33-1 and 33-2. Therefore, in order that the resistance value of the resistor $R_{11}$ is also determined by two P-type portions, the $N^+$-type region 34' is shaped so as to include a portion overlapping with the P-type region 33' and a portion not overlapping with the P-type region 33'. As a result, two P-type portions 33'-1 and 33'-2 determine the resistance value of the resistor $R_{11}$. Representing the lengths of the P-type portion 33'-1 and 33'-2 by $L_{12}$ and $L_{13}$, respectively, in order to realize a resistance ratio of 1:1, the lengths of the P-type portions 33'-1 and 33'-2 are designed so as to fulfill the relationship $L_{10}+L_{11}=L_{12}+L_{13}=L$, and the width of every P-type portion is made identical. Accordingly, the relationships $n=n'=2$ and $\beta=1$ are fulfilled. From Equation-(6), the resistance ratio $R_{11}/R_{10}$ between the resistors $R_{10}$ and $R_{11}$ is derived as follows:

$$\frac{R_{11}}{R_{10}} = \frac{2\Delta L + L}{2\Delta L + L} = 1 \qquad (6)''$$

In other words, a precise resistance ratio of 1:1 can be realized regardless of the lateral diffusion of impurities in the $N^+$-type regions 34 and 34'.

A second preferred embodiment of the present invention is illustrated in FIG. 11. In this preferred embodiment, the resistance value of a pinch resistor $R_{20}$ is designed to be twice as large as that of a pinch resistor $R_{21}$. The pinch resistors $R_{20}$ and $R_{21}$ are formed in an epitaxial layer 40. The pinch resistor $R_{20}$ comprises a rectilinear P-type diffused layer 41 and a comb-shaped $N^+$-type diffused layer 42 having 6 teeth intermittently overlapping with the surface of the P-type diffused layer 41. Contact window 45 for electrodes are formed at both ends of the P-type diffused layer 41. On the other hand, the pinch resistor $R_{21}$ comprises a P-type diffused layer 41' having 4 bent corners and a rectilinear $N^+$-type diffused layer 42' overlapping with the surface of the P-type diffused layer 41' at 3 locations. In addition, contact windows 46 for electrodes are formed at both ends of the P-type diffused layer 41'. In this case, the total length of the six P-type portions overlapped with the $N^+$-type region 42 is chosen to be twice as large as that of the three P-type portions overlapped with the N-type region 42'.

In other words, the illustrated embodiment provides a design of two pinch resistors $R_{20}$ and $R_{21}$ in the case where the P-type region 41 should have an elongated shape while the P-type region 41' should have an S-shape from the viewpoint of a desired pattern layout, and it is desired to select the resistance ratio between the resistors $R_{21}$ and $R_{20}$ to be 1:2. In the illustrated embodiment, since the parameter $\beta=\frac{1}{2}$, $n=6$ and $n'=3$ are given, the resistance ratio $R_{21}/R_{20}$ of the resistor $R_{21}$ to the resistor $R_{20}$ is derived by substituting these parameters into Equation-(6) as follows:

$$\frac{R_{21}}{R_{20}} = \frac{n'\Delta L + L}{n\Delta L + L} = \frac{3\Delta L + \frac{1}{2}L}{6\Delta L + L} = \frac{1}{2} \qquad (6)'''$$

Thus, it will be appreciated that according to the present invention an intended resistance ratio can be realized with high precision.

As described above, according to the present invention, two pinch resistors having a precisely defined resistance ratio can be realized without modifying the shapes of the P-type diffused layers which are determined in view of pattern layout requirements, by merely modifying the shapes of the $N+$-type diffused layers in order that the parameters n, n' and β in Equation-(6) may fulfill the relationship of n'=nβ.

Figure 12:
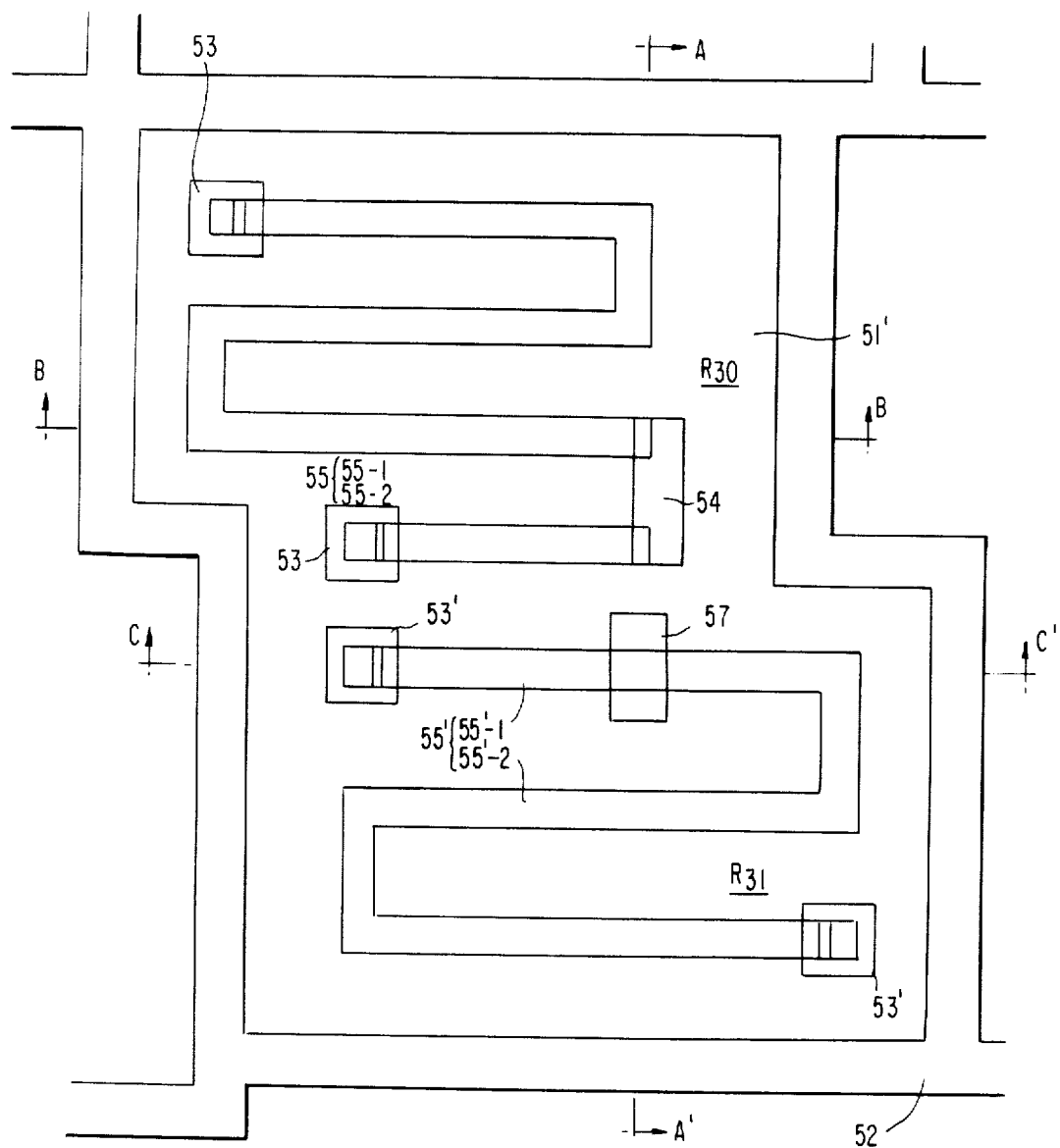
FIG. 12 is a plan view showing a third preferred embodiment of the present invention.
Figure 13:
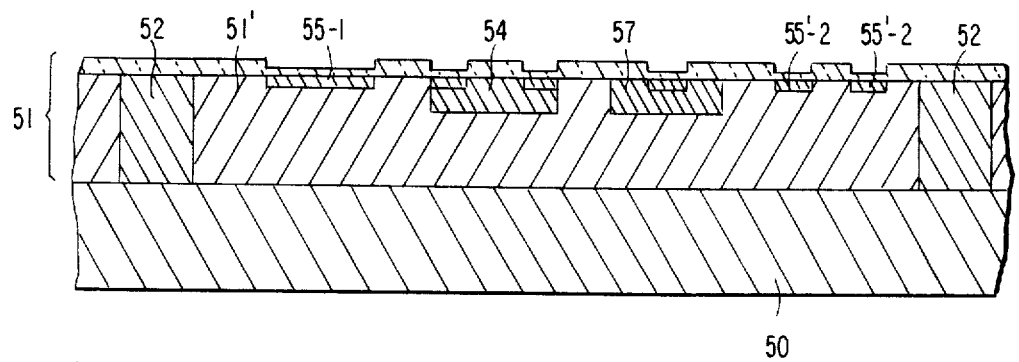
FIGS. 13, 14 and 15 are cross-section views taken along lines A-A' B-B' and C-C' in FIG. 12, respectively.
Figure 14:
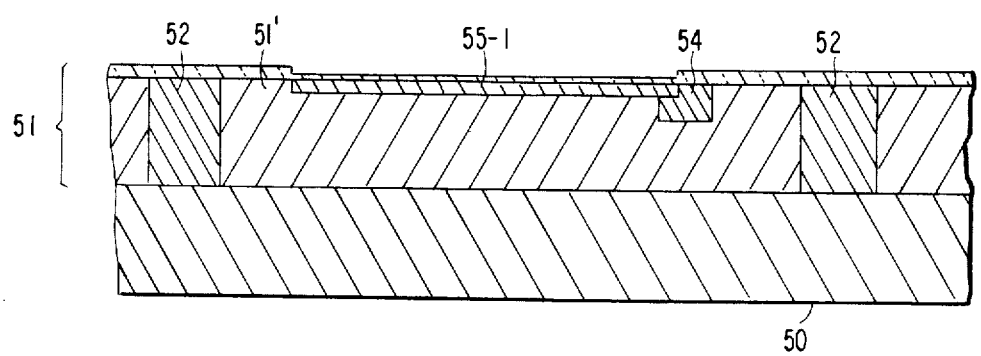
Figure 15:
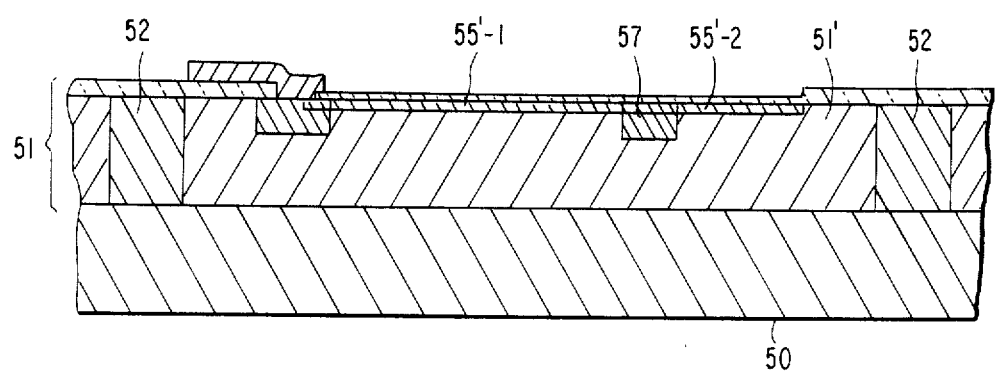

Now a third preferred embodiment of the present invention will be described with reference to FIG. 12. In this preferred embodiment, a resistance ratio between two ion-implanted resistors $R_{30}$ and $R_{31}$ is chosen to be 1:1. Cross-section views taken along lines A–A', B–B' and C–C' in FIG. 12 are respectively shown in FIGS. 13, 14 and 15. The two ion-implanted resistors $R_{30}$ and $R_{31}$ are formed in a bipolar monolithic IC. More particularly, formed on a P-type semiconductor substrate 50 is an N-type epitaxial layer 51, and the epitaxial layer 51 is divided into a plurality of island regions by an isolation region 52. Formed in one island region 51' are electrode contact regions 53 and a region 54 in the resistor $R_{30}$, and electrode contact regions 53' and a region 57' in the resistor $R_{31}$, by selectively diffusing a P-type impurity into the island region 51' simultaneously with the formation of base regions (not shown) of NPN transistors. The depth of these regions is 2.8μ and the surface impurity concentration of these regions is $5 \times 10^{18}$ cm$^{-3}$. Subsequently, after the other semiconductor regions such as the emitter regions of the NPN transistors have been formed, a P-type impurity is selectively ion-implanted under an acceleration energy of 50 KeV and a dosage of $1 \times 10^{13}$ cm$^{-2}$ and then annealed, so that ion-implanted regions 55 and 55' of the shapes shown in FIG. 12 can be formed. The ion-implanted region 55 in the resistor $R_{30}$ extends from one contact region 53, then bends at a substantially right angle 4 times, and further is connected via the P-type region 54 to the other contact region 53. The P-type region 54 is provided for the purpose of allowing an interconnection conductor to pass over the resistor $R_{30}$. The interconnection conductor (not shown) crosses over the P-type region 54. Hence, the resistance of the resistor $R_{30}$ is determined by two ion-implanted regions 55-1 and 55-2. It is to be noted that the ion-implanted region 55-1 has 4 bent corners, and the ion-implanted region 55-2 has no bent corner.

Since no wiring passes over the resistor $R_{31}$, a region corresponding to the region 54 in the resistor $R_{30}$ is not included in the resistor $R_{31}$. Moreover, the ion-implanted region 55' in the resistor $R_{31}$ also includes 4 bent corners. Hence, fluctuations in the resistance ratio caused by a difference in the number of bent corners would not arise between the resistors $R_{30}$ and $R_{31}$. However, the resistance value of the resistor $R_{30}$ is determined by two ion-implanted regions 55-1 and 55-2, whereas that of the resistor $R_{31}$ is determined by the single ion-implanted region 55' if the region 57' is not provided, resulting in an inaccurate resistance ratio. In order to obviate such difficulty, a P-type region 57 formed simultaneously with the P-type regions 53, 53' and 54 is provided in a part of the ion-implanted region 55'. As a result, the resistance value of the resistor $R_{31}$ is determined equivalently by two ion-implanted regions 55'-1 and 55'-2. In this case, the sum $L_{30}+L_{31}$ of the lengths of the two ion-implanted regions 55-1 and 55-2 in the resistor $R_{30}$ is equal to the sum $L_{32}+L_{33}$ of the lengths of the two ion-implanted regions 55'-1 and 55'-2 in the register $R_{31}$, so that the relationship of $L_{30}+L_{31}=L_{32}+L_{33}=L$ is fulfilled. Therefore, the parameters n, n' and β in Equation-(11) are given by β=1 and n=n'=2. Consequently, the resistance ratio $R_{31}/R_{30}$ of the resistor $R_{31}$ to the resistor $R_{30}$ is derived by substituting these parameter values into Equation-(11), as follows:

$$\frac{R_{31}}{R_{30}} = \frac{L - 2\Delta L}{L - 2\Delta L} = 1 \qquad (11)''$$

Thus, a precisely defined resistance ratio of one can be realized.

A fourth preferred embodiment of the present invention is illustrated in FIG. 16. From the viewpoint of a pattern layout, a resistor $R_{40}$ must have a rectilinear shape consisting of one ion-implanted region 60, while an ion-implanted resistor $R_{41}$ must be formed in an S-shape consisting of three ion-implanted regions 60' connected through two high concentration layers 62. Moreover, the resistance ratio $R_{41}/R_{40}$ of the resistor $R_{40}$ is desired to be equal to ½. Since the resistance value of the resistor $R_{41}$ is determined by the three ion-implanted regions 60', the resistance value of the resistor $R_{40}$ should be determined by six ion-implanted regions in order to obtain a precise resistance ratio. For this purpose, five P-type regions 61 formed simultaneously with the layer 62 are provided, so that six ion-implanted regions are formed equivalently in the resistor $R_{40}$. In addition, the total length of the six ion-implanted regions 60 is the resistor $R_{40}$ is twice as large as that of the three ion-implanted partial regions 60' in the resistor $R_{41}$. In this instance, the resistance ratio $R_{41}/R_{40}$ of the resistor 41 to the resistor $R_{40}$ is derived by substituting the parameter values β=½, n=6 and n'=3 into Equation-(11), as follows:

$$\frac{R_{41}}{R_{40}} = \frac{\tfrac{1}{2}L - 3\Delta L}{L - 6\Delta L} = \tfrac{1}{2} \qquad (11)'''$$

From Equation-(11)''', it will be seen that the resistance ratio of the resistor $R_{41}$ to the resistor $R_{40}$ can be precisely defined. Incidentally, regions 63 and 64 are contact regions for electrodes formed simultaneously with P-type regions 61 and 62.

The present invention is equally applicable to the cause where the resistance ratio between two resistors is not an integer. For instance, let us consider the case where a precisely defined resistance ratio between an ion-implanted resistor $R_A$ (not shown) having a resistance value of 10 kohm and another ion-implanted resistor $R_B$ (not shown) having a resistance of 36 kohm is to be realized. In this instance, if the number of the ion-implanted regions in the resistor $R_A$ is 2, then since n'=2×(36/10)=7.2≈7, a precise resistance ratio can be approximately realized by providing 7 ion-implanted regions in the resistor $R_b$. Therefore, the resistance ratio is derived from Equation-(11) as follows:

$$\frac{R_B}{R_A} = \frac{3.6L - 7\Delta L}{L - 2\Delta L} = \frac{3.6(L - 1.95\Delta L)}{L - 2\Delta L} \approx 3.6$$

Another preferred embodiment of the present invention in the case where the intended resistance ratio between two resistors is not an integral ratio, is illustrated in FIG. 17 and will be described in detail in the following. In FIG. 17, the resistance ratio of two resistors $R_{50}$ and $R_{51}$ is selected to be 1.75. In this case, in order to make it possible to obtain the necessary integer numbers of ion-implanted regions in the respective resistors $R_{50}$ and $R_{51}$, the given resistance ratio is mathematically modified into an integral ratio of $R_{50}:R_{51}=1:1.75=4:7$. The preferable shapes of the respective resistors $R_{50}$ and $R_{51}$ are shown in FIG. 17.

More particularly, the resistor $R_{50}$ comprises two ion-implanted regions 60 connected to each other through a high concentration region 62, and each of the ion-implanted partial regions 60 is divided into two regions by a high concentration region 61. As a result, the resistor $R_{50}$ has equivalently four ion-implanted regions 60. The resistor $R_{51}$ comprises three ion-implanted partial regions 60' connected to each other through two high concentration regions 62', and two of the three ion-implanted partial regions 60' are divided into three regions by two high concentration regions 61'. As a result, the resistor $R_{51}$ has equivalently seven ion-implanted regions 60'. Accordingly, the resistance ratio of the resistor $R_{51}$ to the resistor $R_{50}$ is derived by substituting the parameter values $\beta = 7/4$, $n=4$ and $n'=7$ in Equation-(11) as follows:

$$\frac{R_{51}}{R_{50}} = \frac{\frac{7}{4}L - 7\Delta L}{L - 4\Delta L} = 1.75 \quad (11)''''$$

Thus, from Equation-(11)'''', it can be seen that even in the case where the desired resistance ratio is not an integral ratio, the resistance can be realized with high precision.

Figure 18:
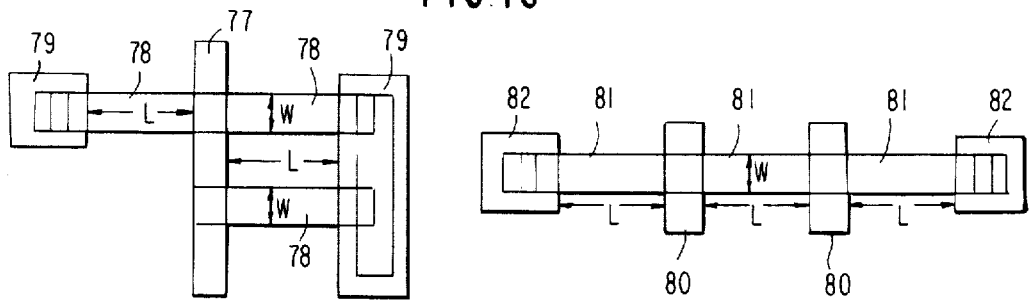

In a sixth preferred embodiment of the present invention illustrated in FIG. 18, the desired resistance ratio is 2. This resistance ratio is realized by forming one resistor $R_{61}$ as a series connection of three ion-implanted regions via two high concentration layers 80 and the other resistor $R_{60}$ as a series-parallel connection of three ion-implanted partial regions 78 via a high concentration layer 77 and contact region 79, respectively. Contact regions 79 and 82 and connecting regions 77 and 80 are formed simultaneously. On the basis of Equation-(7), the respective resistances $R_{60}$ and $R_{61}$ of the resistors $R_{60}$ and $R_{61}$ are derived as follows:

$$R_{61} = \frac{3L - 3\Delta L}{W + \Delta W}$$

$$R_{60} = \frac{L - \Delta L}{W + \Delta W} + \frac{L - \Delta L}{2(W + \Delta W)} = \frac{3(L - \Delta L)}{2(W + \Delta W)}$$

hence, $R_{61}/R_{60} = 2$. From the above analysis, it will be seen that the desired resistance ratio of $R_{61}/R_{60} = 2$ can be precisely realized independently of an extension of lateral diffusion of impurities.

Figure 19:
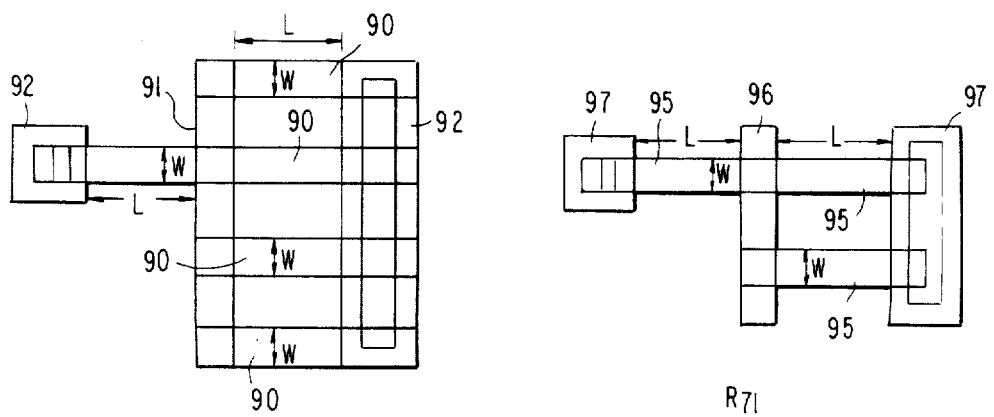

A seventh preferred embodiment of the present invention illustrated in FIG. 19 is the case where the desired resistance ratio is not an integral multiple, but the two resistors $R_{70}$ and $R_{71}$ have a precisely defined resistance ratio of $R_{71}:R_{70} = 1.5:1.25$. In this preferred embodiment also, the two resistors $R_{70}$ and $R_{71}$ to be fabricated are realized in the form of combinations of series-parallel connections according to the desired resistance ratio. The resistor $R_{70}$ has five ion-implanted regions 90, one connecting region 91 and two contact regions 92. The resistor $R_{71}$ has three ion-implanted regions 95, one connecting region and two contact regions 97. Similarly to the embodiment shown in FIG. 18, the respective resistance values $R_{70}$ and $R_{71}$ and their resistance ratio are derived on the basis of Equation-(7), as follows:

$$R_{71} = \frac{L - \Delta L}{W + \Delta W} + \frac{L - \Delta L}{2(W + \Delta W)} = \frac{3(L - \Delta L)}{2(W + \Delta W)}$$

-continued $$R_{70} = \frac{L - \Delta L}{W + \Delta W} + \frac{L - \Delta L}{4(W + \Delta W)} = \frac{5(L - \Delta L)}{4(W + \Delta W)}$$

hence, $$R_{71}/R_{70} = \frac{3}{2} \cdot \frac{4}{5} = \frac{6}{5} = \frac{1.5}{1.25}$$

In this case also, it will be seen that the desired resistance ratio of $R_{71}:R_{70} = 1.5:1.25$ can be precisely realized independently of an expansion of lateral diffusion of impurities.

As described above, according to the present invention, by selecting the numbers of ion-implanted regions of the respective resistors so as to conform to the intended resistance ratio, the ratio can be realized with high precision regardless of the shapes of the resistors. The ion-implanted resistors shown in FIGS. 17 to 19 can be substituted for pinch resistors by regarding ion-implanted regions as P-type portions pinched between two N-type layers.

Incidentally, while the above description has been made in connection with the case where an N-type epitaxial layer is formed on a P-type semiconductor substrate, the above-described principle of the present invention is also valid in the case where a P-type epitaxial layer is formed on an N-type semiconductor substrate. In that case, the same analysis can be made by merely inverting the conductivity types of the respective regions. In addition, the resistance ratio among more than three resistors is obtained accurately by using the present invention. the resistors according to the present invention can also be used in a MOS-type monolithic IC.

What is claimed is:

1. A semiconductor device comprising a first semiconductor layer of one conductivity type; a first resistor formed in said first semiconductor layer, said first resistor including a plurality of first straight regions of an opposite conductivity type formed in said first semiconductor layer and arranged in parallel with each other, at least one first connecting region of said opposite conductivity type formed in said first semiconductor layer and connecting said first straight regions in series, and a second semiconductor layer of said one conductivity type overlapping two portions of one of said first straight regions to form two pinched regions in said one first straight region and overlapping the remaining first straight regions to form one pinched region in each remaining first straight region, a resistance value of said first resistor being substantially determined by the width and length of each of said two pinched regions in said one of said first straight regions and by the width and length of said pinched region in each remaining first straight region; and a second resistor formed in said first semiconductor layer, said second resistor including a plurality of second straight regions of said opposite conductivity type formed in said first semiconductor layer and arranged in parallel with each other, the number of said second straight regions being larger than the number of said first straight regions, a plurality of second connecting regions of said opposite conductivity type formed in said first semiconductor layer and connecting said second straight regions in series, and a third semiconductor layer of said one conductivity type overlapping each of said second straight regions to form one pinched region in each of said second straight regions, a resistance value of said second resistor being substantially determined by the width and length of said pinched region in the respective second straight region; a ratio of the total number of said pinched regions in said first resistor to that of said pinched regions in said second resistor being equal to a resistance ratio of said first resistor to said second resistor.

2. A semiconductor device comprising a semiconductor layer of one conductivity type; a first resistor formed in said semiconductor layer, said first resistor including a plurality of first ion-implanted regions of an opposite conductivity type formed in said semiconductor layer and disposed in parallel with each other and a plurality of first connecting regions of said opposite conductivity type formed in said semiconductor layer and connecting said first ion-implanted regions in series, a resistance value of said first resistor being substantially determined by the width and length of the respective first ion-implanted regions; and a second resistor formed in said semiconductor layer, said second resistor including a plurality of second ion-implanted regions of said opposite conductivity type formed in said semiconductor layer and disposed in parallel with each other, the number of said second ion-implanted regions being smaller than the number of said first ion-implanted regions, at least one second connecting region of said opposite conductivity type formed in said semiconductor layer and connecting said second ion-implanted regions in series, and a high impurity concentration region of said opposite conductivity type having a resistivity lower than the ion-implanted region and crossing one of said second ion-implanted regions to divide said second ion-implanted region into two partial ion-implanted regions, a resistance value of said second resistor being substantially determined by the width and length of said two partial ion-implanted regions and each remaining second ion-implanted region; a ratio of the total number of said first ion-implanted regions to the total number of said two partial ion-implanted regions and the remaining second ion-implanted region being equal to a resistance ratio of said first resistor to said second resistor.

3. A semiconductor device comprising a semiconductor layer of one conductivity type, a first elongated region of opposite conductivity type formed in said semiconductor layer for producing a first resistor, said first elongated region being bent a plurality of times to form a plurality of first line segmental portions, a second elongated region of said opposite conductivity type formed in said semiconductor layer for producing a second resistor, said second elongated region having a width that is equal to the width of said first elongated region and being bent at least once to form at least two second line segmental portions, the ratio in number of said first line segmental portions to said second line segmental portions being different from a resistance ratio of said first resistor to said second resistor, a third semiconductor region of said one conductivity type crossing selected ones of said first line segmental portions in said first elongated region to form a plurality of first pinched regions, the total length of said first pinched regions substantially determining the resistance value of said first resistor, and a fourth semiconductor region of said one conductivity type crossing at least one of said second line segmental portions in said second elongated region to form at least one second pinched region, the length of said at least one second pinched region substantially determining the resistance value of said second resistor, the ratio of the number of crossings between said third semiconductor region and said first line segmental portions to the number of crossings between said fourth semiconductor region and said second line segmental portions being equal to the resistance ratio of said first resistor to said second resistor.

4. A semiconductor device comprising a semiconductor substrate of one conductivity type, a first elongated region of opposite conductivity type formed in said substrate to produce a first resistor, said first elongated region having at least two ion-implanted portions and at least one low resistivity portion for interconnecting said ion-implanted portions, a resistance value of said first resistor being substantially determined by the width and length of the respective ion-implanted portions in said first elongated region, a second elongated region of said opposite conductivity type formed in said substrate to produce a second resistor, said second elongated region having at least one ion-implanted portion, the ratio in the number of the ion-implanted portions between said first and second resistor being different from the resistance ratio between said first and second resistors, and a high impurity concentration region of said opposite conductivity type crossing the ion-implanted portion in said second elongated region to divide the ion-implanted portion into two parts such that the divided two parts are arranged in line on opposite sides of said high impurity concentration region, a resistance value of said second resistor being substantially determined by the width and length of said divided two parts, said high impurity concentration region having a resistivity lower than the ion-implanted portion.

5. A semiconductor device comprising a first strip-shaped semiconductor region for a first resistor, said first strip-shaped semiconductor region being bent in a plan view a plurality of times to form a plurality of first corner portions and having a plurality of first high resistivity portions and at least one low resistivity portion intervening between said first high resistivity portions, widths of said first high resistivity portions being equal to each other and the total length of said first high resistivity portions substantially determining a resistance value of said first resistor, at least one of said first high resistivity portions including a predetermined number of said first corner portions, and a second strip-shaped semiconductor region for a second resistor formed in a configuration different from the configuration of said first strip-shaped semiconductor region, said second strip-shaped semiconductor region being bent in a plan view a plurality of times to form a plurality of second corner portions and having a plurality of second high resistivity portions and at least one low resistivity portion intervening between said second high resistivity portions, a width of each second high resistivity portion being equal to the width of each first high resistivity portion and the total length of said second high resistivity portions substantially determining a resistance value of said second resistor, at least one of said second high resistivity portions including a predetermined number of said second corner portions, a ratio in number of said first high resistivity portions to said second high resistivity portions being equal to a resistance ratio of said first resistor to said second resistor, and a ratio in number of the first corner portions included in said first high resistivity portions to the second corner portions included in said second high resistivity portions being equal to said resistance ratio.

6. A semiconductor device comprising a semiconductor layer of one conductivity type, a first elongated region of an opposite conductivity type formed in said semiconductor layer for producing a first resistor, said first elongated region having a straight shape, a second elongated region of said opposite conductivity type formed in said semiconductor layer for producing a second resistor, said second elongated region having a width equal to the width of said first elongated region and being bent at least once to form at least two line segmental portions, a first region of said one conductivity type crossing said first elongated region a plurality of times to form in said first elongated region a plurality of first pinched regions sandwiched between said semiconductor layer and said first region, the total length of said first pinched regions determining substantially a resistance value of said first resistor, and a second region of said one conductivity type crossing at least one of said at least two line segmental portions to form in said second elongated region at least one second pinched region sandwiched between said semiconductor layer and said second region, the length of said at least one second pinched region determining substantially a resistance value of said second resistor, a ratio of the number of said first pinched regions to said at least one second pinched region being equal to a ratio of the resistance value of said first resistor to said second resistor.

7. A semiconductor device comprising a first semiconductor layer of one conductivity type; a first resistor formed in said first semiconductor layer, said first resistor including a plurality of first straight regions of an opposite conductivity type formed in said first semiconductor layer and arranged in parallel with each other, at least one first connecting region of said opposite conductivity type formed in said first semiconductor layer and connecting said first straight regions in series, and a second semiconductor layer of said one conductivity type overlapping two portions of one of said first straight regions to form two pinched regions in said one first straight region and overlapping the remaining first straight regions to form one pinched region in each remaining first straight region, a resistance value of said first resistor being substantially determined by the width and length of each of said two pinched regions in said one of said first straight regions and by the width and length of said pinched region in each remaining first straight region; and a second resistor formed in said first semiconductor layer, said second resistor including a plurality of second straight regions of said opposite conductivity type formed in said first semiconductor layer and arranged in parallel with each other, the number of said second straight regions being larger than the number of said first straight regions, a plurality of second connecting regions of said opposite conductivity type formed in said first semiconductor layer and connecting said second straight regions in series, and a third semiconductor layer of said one conductivity type overlapping each of said second straight regions to form one pinched region in each of said second straight regions, a resistance value of said second resistor being substantially determined by the width and length of said pinched region in the respective second straight region; a width of each pinched region in said first resistor being equal to that of each pinched region in said second resistor and a ratio of the total length of said pinched regions in said first resistor to that of said pinched regions in said second resistor being equal to the resistance ratio of said first resistor to said second resistor.

8. A semiconductor device comprising a semiconductor layer of one conductivity type; a first resistor formed in said semiconductor layer, said first resistor including a plurality of first ion-implanted regions of an opposite conductivity type formed in said semiconductor layer and disposed in parallel with each other and a plurality of first connecting regions of said opposite conductivity type formed in said semiconductor layer and connecting said first ion-implanted regions in series, a resistance value of said first resistor being substantially determined by the width and length of the respective first ion-implanted regions; and a second resistor formed in said semiconductor layer, said second resistor including a plurality of second ion-implanted regions of said opposite conductivity type formed in said semiconductor layer and disposed in parallel with each other, the number of said second ion-implanted regions being smaller than the number of said first ion-implanted regions, at least one second connecting region of said opposite conductivity type formed in said semiconductor layer and connecting said second ion-implanted regions in series, and a high impurity concentration region of said opposite conductivity type having a resistivity lower than the ion-implanted region and crossing one of said second ion-implanted regions to divide said one second ion-implanted region into two partial ion-implanted regions, a resistance value of said second resistor being substantially determined by the width and length of said two partial ion-implanted regions and each remaining second ion-implanted region; a ratio of the total number of said first ion-implanted regions to the total number of said two partial ion-implanted regions and the remaining second ion-implanted region being equal to a resistance ratio of said first resistor to said second resistor, widths of said first and second ion-implanted regions being equal to one another and a ratio of the total length of said first ion-implanted regions to the total length of said two partial ion-implanted regions and second remaining second ion-implanted region being equal to said resistance ratio.

* * * * *

UNITED STATES PATENT AND TRADEMARK OFFICE
CERTIFICATE OF CORRECTION

PATENT NO. : 4,725,876

DATED : February 16, 1988

INVENTOR(S) : Kishi

It is certified that error appears in the above-identified patent and that said Letters Patent is hereby corrected as shown below:

COLUMN 6, LINE 14    After "respectively." delete "the" and insert --The--;

COLUMN 8, LINE 13    Delete "had" and insert --has--;

COLUMN 8, LINE 49    Delete "Rhd 1" and insert --$R_1$--;

COLUMN 11, LINE 44    Delete "resistor" and insert --resistors--;

COLUMN 12, LINE 44    Delete "by" and insert --to--;

COLUMN 16, LINE 41    Delete "cause" and insert --case--;

COLUMN 18, LINE 33    After "invention." delete "the" and insert --The--.

COLUMN 19, LINE 33    Before "second" insert --one--.

Signed and Sealed this

Third Day of January, 1989

Attest:

DONALD J. QUIGG

Attesting Officer    Commissioner of Patents and Trademarks